United States Patent [19]

Dixon et al.

[11] Patent Number: 5,173,871

[45] Date of Patent: Dec. 22, 1992

[54] METHOD FOR PROVIDING EMI/EMP HARDENING AND BREAKDOWN PROTECTION IN COMPOSITE MATERIALS

[75] Inventors: David S. Dixon, Old Lyme, Conn.; James V. Masi, Wilbraham, Mass.

[73] Assignee: The United States of America as represented by the Secretary of the Navy, Washington, D.C.

[21] Appl. No.: 544,298

[22] Filed: Jun. 20, 1990

[51] Int. Cl.⁵ .............................................. H01B 1/20
[52] U.S. Cl. .................................. 364/802; 252/513; 252/518
[58] Field of Search ................ 364/802; 252/512, 513, 252/514, 518, 519, 520; 174/36; 976/DIG. 331

[56] References Cited

U.S. PATENT DOCUMENTS

| | | | |
|---|---|---|---|
| 4,579,882 | 4/1986 | Kanbe et al. | 976/DIG. 331 |
| 4,665,129 | 5/1987 | Naarmann et al. | 252/517 |
| 4,680,236 | 7/1987 | Myers et al. | 252/518 |
| 4,765,928 | 8/1988 | Thakur | 252/518 |
| 4,824,871 | 4/1989 | Shinomura | 252/518 |
| 4,926,007 | 5/1990 | Aufderheide et al. | 174/36 |
| 4,960,818 | 10/1990 | Reilly et al. | 252/513 |
| 4,963,291 | 10/1990 | Bercaw | 252/518 |
| 5,066,424 | 11/1991 | Dixon et al. | 252/513 |

Primary Examiner—Jerry Smith
Assistant Examiner—Jim Trammell
Attorney, Agent, or Firm—Michael J. McGowan; Prithvi C. Lall; Michael F. Oglo

[57] ABSTRACT

A method of forming a composite material for EMI/EMP hardening protection that has a predictable EM shielding performance in terms of penetration depth is provided. A base material is doped with a predetermined volume fraction of filler particles such that the base material forms a separating contact region between each pair of adjacent filler particles. An electrical equivalent circuit for a filler particle pair and separating contact region is used to represent electrical properties associated with the filler particle pair and separating contact region. A network equivalent impedance of the base material doped with the filler particles is generated using the electrical equivalent circuit. The network equivalent impedance, dielectric constants of the base material and the filler particles, and the predetermined volume fraction of filler particles are used to predict the EM shielding performance of the base material doped with the filler particles in terms of penetration depth.

3 Claims, 1 Drawing Sheet

LEGEND

| | |
|---|---|
| $V_a$ – APPLIED VOLTAGE | $E_c$ – CONDUCTION BAND ENERGY |
| $E_v$ – VALENCE BAND ENERGY | $E_g$ – ENERGY GAP |
| $J_h$ – HOLE CURRENT DENSITY | $J_t$ – TUNNELL CURRENT DENSITY |

METHOD FOR PROVIDING EMI/EMP HARDENING AND BREAKDOWN PROTECTION IN COMPOSITE MATERIALS

STATEMENT OF GOVERNMENT INTEREST

The invention described herein may be manufactured and used by or for the Government of the United States of America for governmental purposes without the payment of any royalties thereon or therefore.

This patent application is co-pending with related patent application entitled "Composite Material for EMI/EMP Hardening Protection in Marine Environments" by the same inventors filed on the same date as this application.

BACKGROUND OF THE INVENTION (1) Field of the Invention

The present invention relates to a method for designing composite materials and more particularly to a method for predicting electro-magnetic shielding performance of a composite material for use in a corrosive marine environment.

(2) Description of the Prior Art

It is well known that material manufacturers are attempting to develop composite materials that maintain some of the characteristics of metals in order to substitute composite electrical enclosures for existing metal ones. In particular, these characteristics include conductivity and EM shielding abilities. Often, materials did not pass EM testing in the lab or passed in the lab but failed in the field. Such trial and error methods are costly and time consuming. In the past no electromagnetic (EM) model existed for prediction of the EM performance of conductive and semi-conductive fillers that are added to a basic matrix material such as resin to enhance its EM properties. Also, conductive fillers often produced galvanic corrosion when the composite was used in a marine environment, especially when placed in contact with metals further away on the galvanic chart.

SUMMARY OF THE INVENTION

Accordingly, it is a general purpose and object of the present invention to provide a method for predicting the EM shielding performance of proposed composite materials.

It is a further object that such method be able to provide conductive composite materials without producing excessive corrosion.

Another object is that such method permit inputs of the expected operating environment characteristics that such composite materials will be exposed to.

Still another object is that such method permit development of long lived composites for marine environments.

These objects are accomplished with the present invention by providing an electrical equivalent circuit for each particle-to-particle contact region and an overall electromagnetic prediction model for defining a complex composite material comprising conducting and semi-conducting particles, fibers, or flakes embedded in a matrix of polymeric material. Such materials are useful in connectors, junction boxes, enclosures or similar electromagnetic shielding applications. The model's predictive capability enables development of a range of composite materials with the preselected conductivity, corrosion resistance, EM shielding and pulse breakdown capabilities. Use of such a composite material with the electromagnetic (EM shielding properties built into the material itself, when combined with the use of conductive and semi-conductive fillers that minimize the corrosive effect of electrochemical potential differences, ensures that EM shielding and corrosion resistance is maintained in these materials when they are used in marine and aircraft environments. The model also includes the novel effect that oxide semiconductor materials combined with electromagnetically/galvanically compatible conductive fillers provide a basis for a new class of EMI and EMP composite materials that exhibit stable current controlled and voltage controlled negative resistance (VCNR, CCNR) characteristics. Testing has shown that the conductivities of these materials increase as the field strength and/or the voltage increases. Such characteristics are highly desirable for providing inherent protection to electronic circuits from higher level voltages or currents. This VCNR/CCNR effect is dependent upon the voltage, the combination of filler materials and the percent of filler loading. The latter two factors also have a direct bearing on many of the other composite material properties and characteristics.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein.

DESCRIPTION OF THE PREFERRED EMBODIMENT

Figure 1:
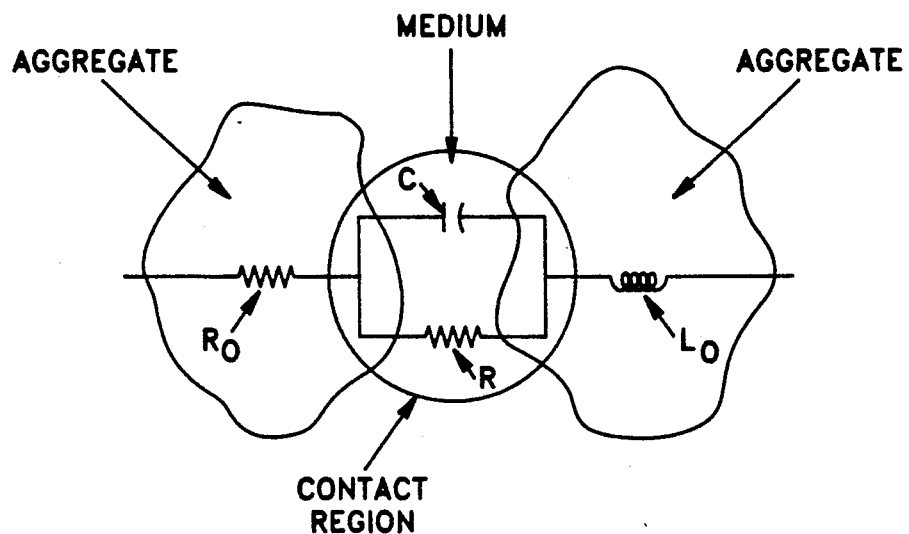
FIG. 1 shows an electromagnetic equivalent circuit model for the particle interface region of composite materials.

Referring now to FIG. 1 there is shown an electromagnetic equivalent circuit model including a pair of filler particles in contact with one another over a contact region. The circuit is a series connection of a resistive element $R_o$, an inductive element $L_o$ and a parallel combination of a resistive element R and a capacitive element C, the latter combination representing the contact region. It is noted that $L_o$ may generally be neglected for frequencies below 50 MHz. The primary contributor to the impedance Z of the equivalent circuit are the capacitive and resistance elements of the contact region.

Figure 2:
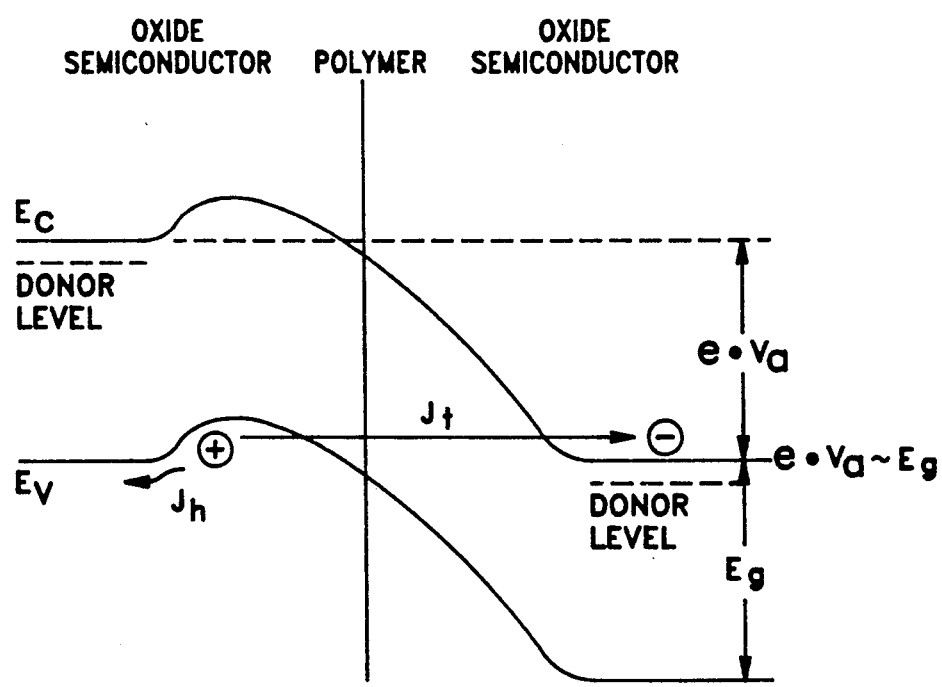
FIG. 2 shows the tunnelling effect occurring in samples of composite material appropriately doped with semi-conductive filler.

FIG. 2 shows the tunnelling effect that occurred in test samples of composites doped with semi-conductive fillers. These test samples are described more fully in our co-pending U. S. patent application Ser. No. 07/544297, U.S. Pat. No. 5066424 entitled "Composite Material for EMP Hardening Protection in Marine Environments". During testing of these preselected 15% ITO/10% Ni-Flake /75% polymer composite samples the resistance decreased from 0.95 Ohms to <0.7 Ohms as the applied voltage was increased from 0.2 millivolts to 8 millivolts (10 kHz<f<10 MHz). The tunneling effect represents the theoretical explanation for the charge transfer that occurs within the composite during times of applied voltage.

The preferred composite embodiments described above, i.e., ITO/Nickel Flake in a PEEK polymer matrix, ITO/Nickel Flake with inherently conductive plastic in a polycarbonate polymer matrix, and ITO/Nickel Flake in a polycarbonate matrix, all exhibited such charge transfer due to the tunneling phenomena.

The mechanical properties of a composite depend upon the relative proportions of resin and filler, and the size, shape, state of aggregation or agglomeration, relative dispersion, and orientation of filler. Further, the level of interphase adhesion affects ultimate strength and elongation of the material and provides a measure of the unwanted condition known as "pull away". For example, for fibers with a circular or square cross-section a simplified method for predicting the tensile an transverse modulus of elasticity for a composite is to employ the Halpin-Tsai equations, i.e., Tensile:

$$E_c(\text{ten.}) = V_f E_f + V_m E_m, \quad (1)$$

and

Transverse:

$$E_c(\text{tran.}) = [(1 + 2nV_f)/(1 - nV_f)] E_m \quad (2)$$

where $n = [(E_f/E_m) - 1]/[(E_f/E_m) + 2]$, $E_c$ is the modulus of the composite, $E_f$ and $E_m$ are the moduli of the filler and the matrix, respectively, and $V_f$ and $V_m$ are the volume fractions of the filler and matrix, respectively. Equations (1) and (2) represent the basis upon which the mechanical properties of the desired composite are predicted.

There are a number of prior art theoretical models which conditionally predicted the electrical properties of composites. These models were based upon the hopping model taught in Mott, N. F., Adv. Phys. (Philos. Mag. Suppl.), 16:49 (1967), the percolation theory taught in McCullough, R. L., Composites Science and Technology, 22:3 (1985), the critical loading approach taught in Bhattacharya, S. K., "Metal Filled Polymers: Properties and Applications", Marcel Dekker, N. Y., 1986. pp. 170, ff, or upon simple RC networks such as taught in Sichel, E. K., "Carbon Black Polymer Composites", Marcel Dekker, N. Y., 1982. pp. 152, ff.

The present invention establishes a verifiable model which predicts the electromagnetic properties of a composite when provided with a set of specific component material parameter inputs. The total impedance Z(total) of a three dimensional distributed network of equivalent impedances Z(equiv.) can be shown to be, $$Z(\text{total}) = mZ(\text{equiv.})/16 \quad (3)$$

where:

m is the aspect ratio of length to width of a particular test specimen and Z(equiv.) is the equivalent impedance of the particle/matrix combination. The equivalent impedance Z(equiv.) is calculated based upon the schematic of the resistor, capacitor, and inductor circuit shown in FIG. 1.

Using the filler model which relates the resistivity of the filler material to that of the composite via the volume fraction of the filler, the resistivity of the combination can be calculated, theoretically, for these small interparticle dimensions.

$$\rho = (V_f/3)[1/(1 - (-V_f/3))]\rho_o \quad (4)$$

Using form factors for the particle, flake, or fiber, and combining this with a three-dimensional polymer matrix, leads to a solvable set of equations involving resistors, capacitors, and inductors at various frequencies and fields. The model needs inputs with respect to the electric field and the frequency dependence of the resistive and reactive elements, i.e. $R(E,\omega)$ and $X(E,\omega)$.

A composite sample under an applied field has its potential distribution curves bent more drastically over the conducting filler contacts due to space charge. For purposes of simplicity, the particle/flake/fiber is assumed to have smooth contours and the polymer matrix is electrically homogeneous and isotropic. A number of researchers have noted that current controlled negative resistance (CCNR) is observed (voltage dependent threshold initiation) Pike, J. N., Private Communication, UCRI 618 (1970), p. 155. Local heating of the matrix/conductive filler is deemed to be the cause, the result being quasi-filamentary conduction. This implies that, as the voltage (field) increases across such a composite element, the conductivity and, as a result the shielding effectiveness, increases. This effect is enhanced by certain fillers, such as semiconductive oxides which themselves exhibit CCNR or voltage controlled negative resistance (VCNR).

According to the electrical model shown (ignoring for now the aforementioned inductive component which is negligible for frequencies under 50 MHz), the equivalent $R_o/R(E,\omega)/C(E,\omega)$ circuit impedance decreases with increasing frequency. This, combined with CCNR or VCNR, indicates that the composite with semiconducting particles, flakes, or fibers (or combinations thereof) is an improved shield, not only for EMI, but also for EMP applications.

The method of the instant invention starts with applying the effective medium theory taught by Sichel, E.K., et al., J. Electron. Matter. 22:3, 77 (1982), to the conductivity and the complex dielectric constant of the composite material to obtain the relationship between the properties of the matrix and those of its components by means of the equation, $$\alpha \quad \frac{V_f(\epsilon_f^* - \epsilon_c^*)}{(\epsilon_f^* + 2\epsilon_c^*)} = -\frac{(1 - V_f)(\epsilon_m^* - \epsilon_c^*)}{(\epsilon_m^* + 2\epsilon_c^*)} \quad (5)$$

where $\epsilon_f^*$, $\epsilon_m^*$, and $\epsilon_c^*$ are the complex dielectric constants of the filler, matrix, and composite, respectively, and $V_f$ is the volume fraction of the filler. Rearranging the terms of equation (5) yields, $$[2(-2V_F)](\epsilon_c^*)^2 + [(V_f+1)\epsilon_f^* - (2 - 3V_f)\epsilon_m^*]\epsilon_c^* + \epsilon_f^* \epsilon_m^* = 0 \quad (6)$$

Applying the quadratic relationship to equation (6) yields, $$\epsilon_c^* = \frac{-(V_f + 1)\epsilon_f^* - (2 - 3V_f)\epsilon_m^* \pm \sqrt{[(V_f + 1)\epsilon_f^* - (2 - 3V_f)\epsilon_m^*]^2 - 8(1 - 2V_f)\epsilon_f^*\epsilon_m^*}}{4(1 - 2V_f)} \quad (7)$$

Breaking equation (7) up into real and imaginary parts yields, $$\epsilon_c^* = \epsilon_c - j\left(\frac{\sigma_c}{\omega\epsilon_o}\right) \quad (8a)$$

$$\epsilon_f^* = \epsilon_f - j\left(\frac{\sigma_f}{\omega\epsilon_o}\right) \quad (8b)$$

$$\epsilon_m^* = \epsilon_m - j\left(\frac{\sigma_m}{\omega\epsilon_o}\right) \quad (8c)$$

where $\epsilon_o$ is the permittivity of free space, and $\sigma_c$, $\sigma_f$ and $\sigma_m$ are the conductivities of the composite, the filler and the matrix respectively. Equation (8a) is then solved for $\sigma_c$. Penetration depth $d_p$ is the depth at which the electric field $=1/e$ of its original value and is defined as, $d_p=1/k_1$. The attenuation k is, $$k = k_R - jk_1 = \omega\sqrt{\mu\epsilon}\left[1 - j\frac{\sigma}{\omega\epsilon}\right]^{\frac{1}{2}} \quad (9)$$

For a "highly conductive" composite, $$k_1 = \frac{1}{d_p} = \frac{\sigma_c}{2}\sqrt{\frac{\mu_c}{\epsilon_c}} \quad (10)$$

where $k_1$ is in Nepers/meter, $\mu=\mu_c\mu_o$, $\epsilon=\epsilon_c\epsilon_o$, $\mu_o=4\pi\times10^{-}H/m$, and $\epsilon_o=(1/36\pi)\times10^{-9}$ F/m. To convert to dB, $k_{1dB}$=attenuation=$(k_1/2.303)\times20$ (dB/m). To then get shielding effectiveness (S.E.), S.E.=$k_{1dB}\times$(thickness of composite in meters).

In actual practice of course one begins with a desired shielding effectiveness and works back through the above equations to determine the appropriate volume fractions needed to produce the composite that will provide the desired S.E.

The semiconductive oxide composite samples behave in a manner which does not fit established empirical theories. The results shown in the FIGURES indicate that there is a strong dependence of the real part of the impedance (resistance) on both electric field and frequency. Dependence of resistance on frequency and electric field appears to have a d.c. value superimposed on a reciprocal dependence with respect to both frequency and electric field. This magnitude of dependence seems to decrease with metallic loading.

The electrochemical properties are indeed interesting, showing a marked dependence on the aforementioned oxide "adaptability" in systems in contact with aluminum alloys.

These properties lead to a provision for oxide semiconduction properties and a possible charge modification of the "dielectric" (PEEK) due to the electronic/chemical synergy associated with this composite. The band model involving a tunnelling mechanism between the oxide semiconductor and the dielectric is preselected in FIG. 2.

It will be understood that various changes in the details, materials, steps and arrangement of parts, which have been herein described and illustrated in order to explain the nature of the invention, may be made by those skilled in the art within the principle and scope of the invention as expressed in appended the claims.

The advantages of the present invention over the prior art are that all properties desired may be obtained in a predictable fashion.

What has thus been described is an electrical equivalent circuit and an electromagnetic prediction model for composite materials comprising conducting and semiconducting particles, fibers, or flakes in a matrix of polymeric material for use in connectors, junction boxes, enclosures or similar electromagnetic shielding applications. The development of this model and predictive capability will enable one to develop a range of composite materials with the desired Conductivity, Corrosion Resistance, EM Shielding and Pulse Breakdown capabilities. Only the use of a composite material with electromagnetic (EM) shielding properties built into the material itself, combined with the use of conductive and semi-conductive fillers that will minimize the corrosive effect of electrochemical potential differences, will provide a total long-term solution to ensure that EM shielding and corrosion resistance is maintained in these materials when they are used in marine and aircraft environments.

The equivalent circuit and model also considers the effect that oxide semiconductor materials and electromagnetically and/or galvanically compatible conductive fillers also provide a basis for a new class of EMI and EMP composite materials that exhibit a stable current-and-voltage-controlled negative resistance (VCNR, CCNR) characteristic. Testing has shown that the conductivities of these materials increase as the field and/or the voltage increases. This characteristic is desirable to provide inherent protection of electronic circuits from higher level voltages or currents. This VCNR/CCNR effect is dependent upon the voltage, the degree of filler material combinations and filler loading which will determine the composite materials properties.

Obviously many modifications and variations of the present invention may become apparent in light of the above teachings.

In light of the above, it is therefore understood that within the scope of the appended claims, the invention may be practiced otherwise than as specifically described.

What is claimed is:

1. A method of forming a composite material for EMI/EMP hardening protection that has a predictable EM shielding performance in terms of penetration depth, comprising the steps of:

doping a base material with a predetermined volume fraction of filler particles, the base material forming a separating contact region between each pair of adjacent filler particles, wherein an electrical equivalent circuit for a filler particle pair and separating contact region is used to represent electrical properties associated with the filler particle pair and separating contact region, the electrical equivalent circuit being represented as a series connection of a first resistive element formed by a first filler particle of the filler particle pair, an inductive element formed by a second particle of the filler particle pair and a parallel combination of a second resistive element and a capacitive element formed by the separating contact region;

providing dielectric constants of the base material and the filler particles; and generating a network equivalent impedance of the base material doped with the filler particles using the electrical equivalent circuit, wherein the network equivalent impedance, the predetermined volume fraction of filler particles, and dielectric constants of the base material and the filler particles are used to predict the EM shielding performance of the base material doped with the filler particles in terms of penetration depth.

2. A method according to claim 1 wherein the base material in a polymer matrix material.

3. A method according to claim 1 wherein said step of doping includes the step of selecting tiller particles that are at least semi-conductive to minimize corrosion of the composite material doped with the filler particles.

* * * * *